(12) United States Patent
Wiscombe et al.

(10) Patent No.: US 11,430,504 B2
(45) Date of Patent: Aug. 30, 2022

(54) ROW CLEAR FEATURES FOR MEMORY DEVICES AND ASSOCIATED METHODS AND SYSTEMS

(71) Applicant: Micron Technology, Inc., Boise, ID (US)

(72) Inventors: Miles S. Wiscombe, Boise, ID (US); Scott E. Smith, Plano, TX (US); Gary L. Howe, Allen, TX (US); Brian W. Huber, Allen, TX (US); Tony M. Brewer, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/005,034

(22) Filed: Aug. 27, 2020

(65) Prior Publication Data

US 2022/0068349 A1 Mar. 3, 2022

(51) Int. Cl.
| | |
|---|---|
| *G06F 13/28* | (2006.01) |
| *G11C 11/408* | (2006.01) |
| *G11C 11/4096* | (2006.01) |
| *G11C 11/406* | (2006.01) |
| *G11C 11/4094* | (2006.01) |

(52) U.S. Cl.
CPC ...... *G11C 11/4085* (2013.01); *G11C 11/4096* (2013.01); *G11C 11/40615* (2013.01); *G11C 11/4087* (2013.01); *G11C 11/4094* (2013.01)

(58) Field of Classification Search
CPC .......... G11C 11/4085; G11C 11/40615; G11C 11/4096; G11C 11/4087; G11C 11/4094
USPC .......................................................... 711/105
See application file for complete search history.

(56) References Cited

U.S. PATENT DOCUMENTS

| | | | | |
|---|---|---|---|---|
| 6,728,147 | B2* | 4/2004 | Beer | G11C 29/10 |
| | | | | 365/189.02 |
| 2003/0135699 | A1* | 7/2003 | Matsuzaki | G11C 11/24 |
| | | | | 711/149 |
| 2007/0088903 | A1* | 4/2007 | Choi | G11C 7/1045 |
| | | | | 711/100 |
| 2013/0107649 | A1* | 5/2013 | Cho | G11C 29/46 |
| | | | | 365/201 |
| 2015/0234738 | A1* | 8/2015 | Ware | G06F 12/0292 |
| | | | | 711/165 |

* cited by examiner

*Primary Examiner* — Huan Hoang
(74) *Attorney, Agent, or Firm* — Perkins Coie LLP

(57) ABSTRACT

Memory devices, systems including memory devices, and methods of operating memory devices are described, in which memory devices are configured to provide row clear features. In some embodiments, the memory device may receive a command from a host device directed to a row of a memory array included in the memory device. The memory device may determine that the command is directed to two or more columns associated with the row, where each column is coupled with a group of memory cells. The memory device may activate the row to write the two or more columns using a set of predetermined data stored in a register of the memory device. Subsequently, the memory device may deactivate the word line based on writing the set of predetermined data to the two or more columns.

19 Claims, 5 Drawing Sheets

ROW CLEAR FEATURES FOR MEMORY DEVICES AND ASSOCIATED METHODS AND SYSTEMS

TECHNICAL FIELD

The present disclosure generally relates to memory devices, and more particularly relates to row clear features for memory devices and associated methods and systems.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and nonvolatile memory. Volatile memory, including random-access memory (RAM), static random-access memory (SRAM), dynamic random-access memory (DRAM), and synchronous dynamic random-access memory (SDRAM), among others, require a source of applied power to maintain its data. Nonvolatile memory, by contrast, can retain its stored data even when not externally powered. Nonvolatile memory is available in a wide variety of technologies, including flash memory (e.g., NAND and NOR), phase change memory (PCM), ferroelectric random-access memory (FeRAM), resistive random-access memory (RRAM), and magnetic random-access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

The present disclosure will be understood more fully from the detailed description given below and from the accompanying drawings of various embodiments of the disclosure. The components in the drawings are not necessarily to scale. Instead, emphasis is placed on illustrating clearly the principles of the present technology.

DETAILED DESCRIPTION

Figure 1:
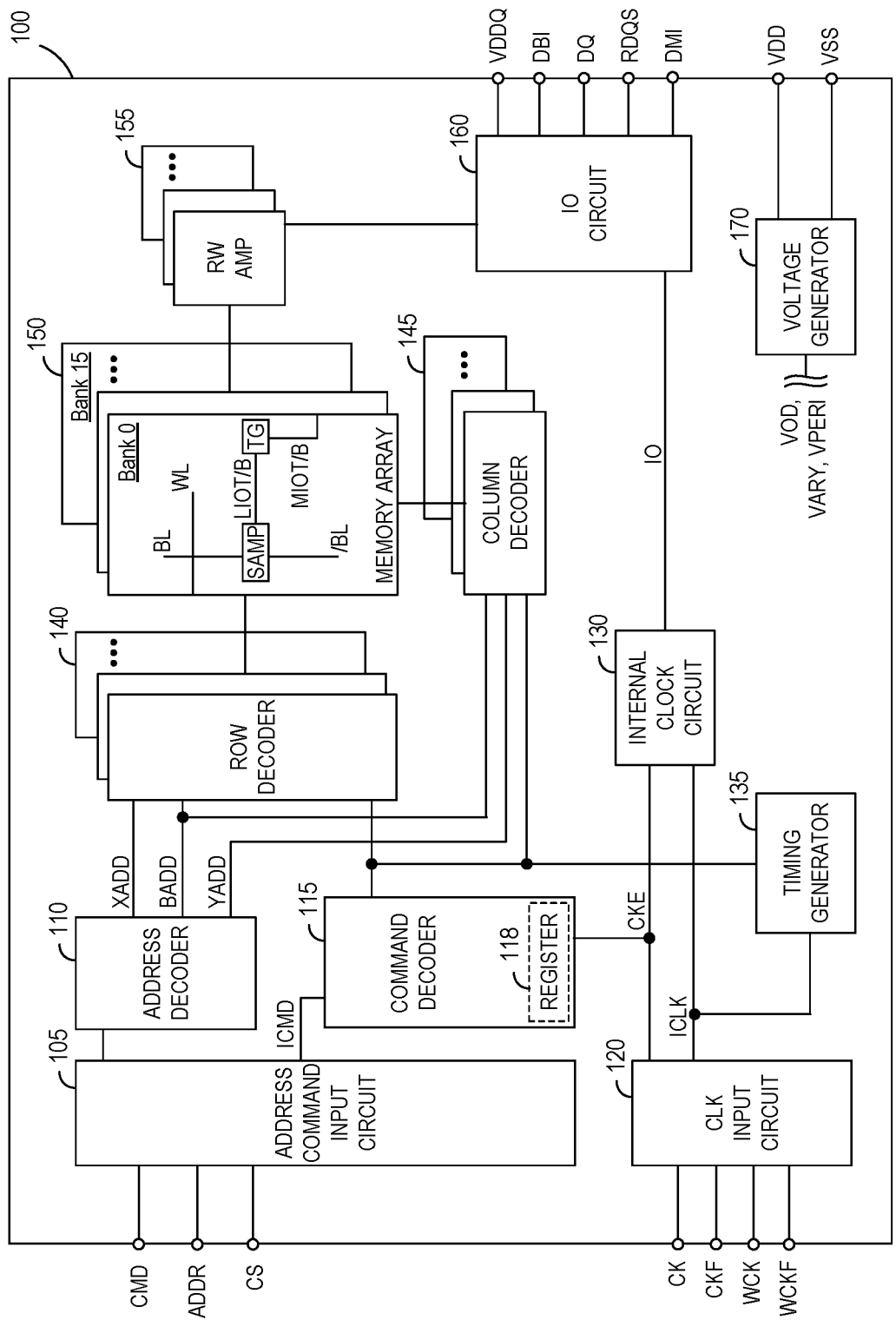
FIG. 1 is a block diagram schematically illustrating a memory device in accordance with embodiments of the present technology.

Methods, systems, and apparatuses for memory devices (e.g., DRAM) are disclosed, which provide row clear features. When a host device (e.g., a memory controller) allocates memory space (e.g., a portion of a memory array) of memory devices, the memory controller may place individual memory cells of the memory space in known states (e.g., a logic state of 1 or a logic state of 0 of binary data) by writing a set of predetermined data. Such an operation may be referred to as "clearing" (or "preclearing") in view of removing existing previous data stored in the memory cells. A sequence of 1's and 0's of binary data may be referred to as a data pattern or a pattern of bits.

In some embodiments, the memory controller may, to clear the memory space, issue a write command to the memory device along with the set of predetermined data—e.g., providing the data on a data bus coupled with the memory device. Subsequently, the memory device can receive the data through the data bus to write the data at a memory location designated by an address (e.g., a column address) included in the write command—e.g., clearing the memory location corresponding to the column address by "over-writing" the memory cells coupled with the column using the set of predetermined data. In some cases, writing data in a group of memory cells coupled with a column (a bit line) of a memory array identified by a corresponding column address may be referred to as writing the data to the column. If the memory controller needs to allocate memory space greater than a single write command can clear at a time (e.g., 4 bytes, 8 bytes, 16 bytes, etc.), the memory controller may repeat issuing the write command (with a different column address each time) while providing the data on the data bus for each one of multiple write commands. Such repetitions may occupy the command/address bus and the data bus for an extended period of time (e.g., when clearing 256 bytes, 512 bytes, 1,024 bytes, etc.) and consume significant power during memory operations.

Several embodiments of the present technology are directed to clearing a portion of a memory array with a single command without repeatedly performing external write commands issued to a memory device including the memory array. In some embodiments, the single command may clear all the memory cells coupled with a word line (a row), and may be referred to as a row clear command. Alternatively, the single command may clear a subset of the memory cells of the row—e.g., memory cells corresponding to two or more column addresses associated with the row. Further, a set of predetermined data for the row clear command may be internally available to the memory device (e.g., stored in a register of the memory device) such that a host device does not need to provide the data on a data bus during the row clear operation. In this manner, the present technology facilitates clearing the portion of the memory array without occupying the command/address and data bus for an extended period of time.

The present technology may provide additional advantages when compared to repeatedly performing external write commands, such as consuming less power during the clearing operations, clearing the row (or a portion of the row) in a less time, among others. For example, as the data pattern for the memory device to use is internally available (e.g., stored in the register), the host device does not need to drive data terminals (DQ) of the memory device with the data pattern, thereby reducing power consumption. In addition, as the data pattern to write to the columns is identical from one column address to another (e.g., repeating the pattern of the bits to the two or more columns), the memory device may maintain write drivers with the data pattern established for writing a first column of the row when writing all the subsequent columns (or a subset of columns), thereby avoiding power consumption associated with toggling the write drivers. Further, timing parameters necessary to be maintained between writing one column to another may be tightened—e.g., by bypassing a duration for stabilizing a data input buffer of the memory device with external data, by expeditiously moving to the next column without decoding the next column address as the memory device "knows" the next column to select to write the data, or the like.

A memory device that supports embodiments of the present technology is described with reference to FIG. 1. More detailed descriptions of a memory array that supports embodiments of the present technology are provided with reference to FIG. 2. Schematic descriptions of memory devices configured to support row clear features in accordance with embodiments of the present technology are provided with reference to FIG. 3. A memory system including a memory device in accordance with embodiments of the present technology is described with reference to FIG. 4. A method of operating the memory device for row clear features in accordance with embodiments of the present technology is described with reference to FIG. 5.

FIG. 1 is a block diagram schematically illustrating a memory device 100 in accordance with embodiments of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells (e.g., m×n memory cells) arranged at intersections of the word lines (e.g., m word lines, which may also be referred to as rows) and the bit lines (e.g., n bit lines, which may also be referred to as columns). In some embodiments, each bit line address (each column address) associated with a particular row may include multiple bit lines (columns) coupled with multiple memory cells—e.g., across multiple banks, via a tiered bit line architecture with local and main/global bit lines. Each word line of the plurality may be coupled with a corresponding word line driver (WL driver) configured to control a voltage of the word line during memory operations.

Memory cells can include any one of a number of different memory media types, including capacitive, phase change, magnetoresistive, ferroelectric, or the like. In some embodiments, a portion of the memory array 150 may be configured to store ECC bits. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least one respective main I/O line pair (MIOT/B), via transfer gates (TG), which can function as switches. The memory array 150 may also include plate lines and corresponding circuitry for managing their operation.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI (for data bus inversion function), and DMI (for data mask inversion function), power supply terminals VDD, VSS, VDDQ, and VSSQ.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140 (which may be referred to as a row driver), and a decoded column address signal (YADD) to the column decoder 145 (which may be referred to as a column driver). The address decoder 110 can also receive the bank address portion of the ADDR input and supply the decoded bank address signal (BADD) and supply the bank address signal to both the row decoder 140 and the column decoder 145.

The command and address terminals may be supplied with command signals CMD, address signals ADDR, and chip select signals CS, from a memory controller. The command signals may represent various memory commands from the memory controller (e.g., refresh commands, activate commands, precharge commands, access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105.

The command decoder 115 may include circuits to decode the internal command signals ICMD to generate various internal signals and commands for performing memory operations, for example, a row command signal to select a word line and a column command signal to select a bit line. Other examples of memory operations that the memory device 100 may perform based on decoding the internal command signals ICMD includes a refresh command (e.g., re-establishing full charges stored in individual memory cells of the memory array 150), an activate command (e.g., activating a row in a particular bank, in some cases for subsequent access operations), or a precharge command (e.g., deactivating the activated row in the particular bank). The internal command signals can also include output and input activation commands, such as clocked command CMDCK (not shown in FIG. 1).

The command decoder 115, in some embodiments, may further include one or more registers 118 for tracking various counts and/or values (e.g., counts of refresh commands received by the memory device 100 or self-refresh operations performed by the memory device 100) and/or for storing various operating conditions for the memory device 100 to perform certain functions, features, and modes (or test modes). As such, in some embodiments, the registers 118 (or a subset of the registers 118) may be referred to as mode registers. Additionally, or alternatively, the memory device 100 may include registers 118 as a separate component out of the command decoder 115. In some embodiments, the registers 118 may include multi-purpose registers (MPRs) configured to write and/or read specialized data to and/or from the memory device 100.

When a read command is issued to a bank with an open row and a column address is timely supplied as part of the read command, read data can be read from memory cells in the memory array 150 designated by the row address (which may have been provided as part of the activate command identifying the open row) and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (e.g., the register 118). The read latency information RL can be defined in terms of clock cycles of the CK clock signal. For example, the read latency information RL can be a number of clock cycles of the CK signal after the read command is received by the memory device 100 when the associated read data is provided.

When a write command is issued to a bank with an open row and a column address is timely supplied as part of the write command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (e.g., register 118). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VOD, VARY, VPERI, and the like based on the power supply potentials VDD and VSS. The internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command decoder 115.

For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

The memory device 100 can be connected to any one of a number of electronic devices capable of utilizing memory for the temporary or persistent storage of information, or a component thereof. For example, a host device of memory device 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to memory device 100, although in other embodiments, the host device may be indirectly connected to memory device (e.g., over a networked connection or through intermediary devices).

In some embodiments, the memory device 100 may receive a command from a host device (e.g., a memory controller), directed to one of the word lines (rows) of the memory array 150. The memory device 100 may determine that the command is directed to two or more columns (bit lines) associated with the row, where each column is coupled with a group of memory cells. In some embodiments, the memory device 100 make such determination based on an indication stored in one or more bits of the command (e.g., in conjunction with the command decoder 115) and/or in a register of the memory device 100 (e.g., the register 118). The memory device 100, in response to receiving the command, may activate the word line (e.g., open the row) such that the memory device 100 can write the two or more columns of the row with a set of predetermined data. In this regard, the host device may have devised (determined) the set of predetermined data and stored the data in a register (e.g., the register 118 or a different register) of the memory device 100 such that the data pattern can be internally available to the memory device 100, prior to performing the command. In some embodiments, the memory device 100 may utilize a counter (or a part of the register 118) to track which columns have been selected to write the data and which columns remain to be written. Subsequently, the memory device 100 may deactivate the word line (e.g., close the row) based, at least in part, on writing the set of predetermined data to the two or more columns of the memory array 150.

Figure 2:
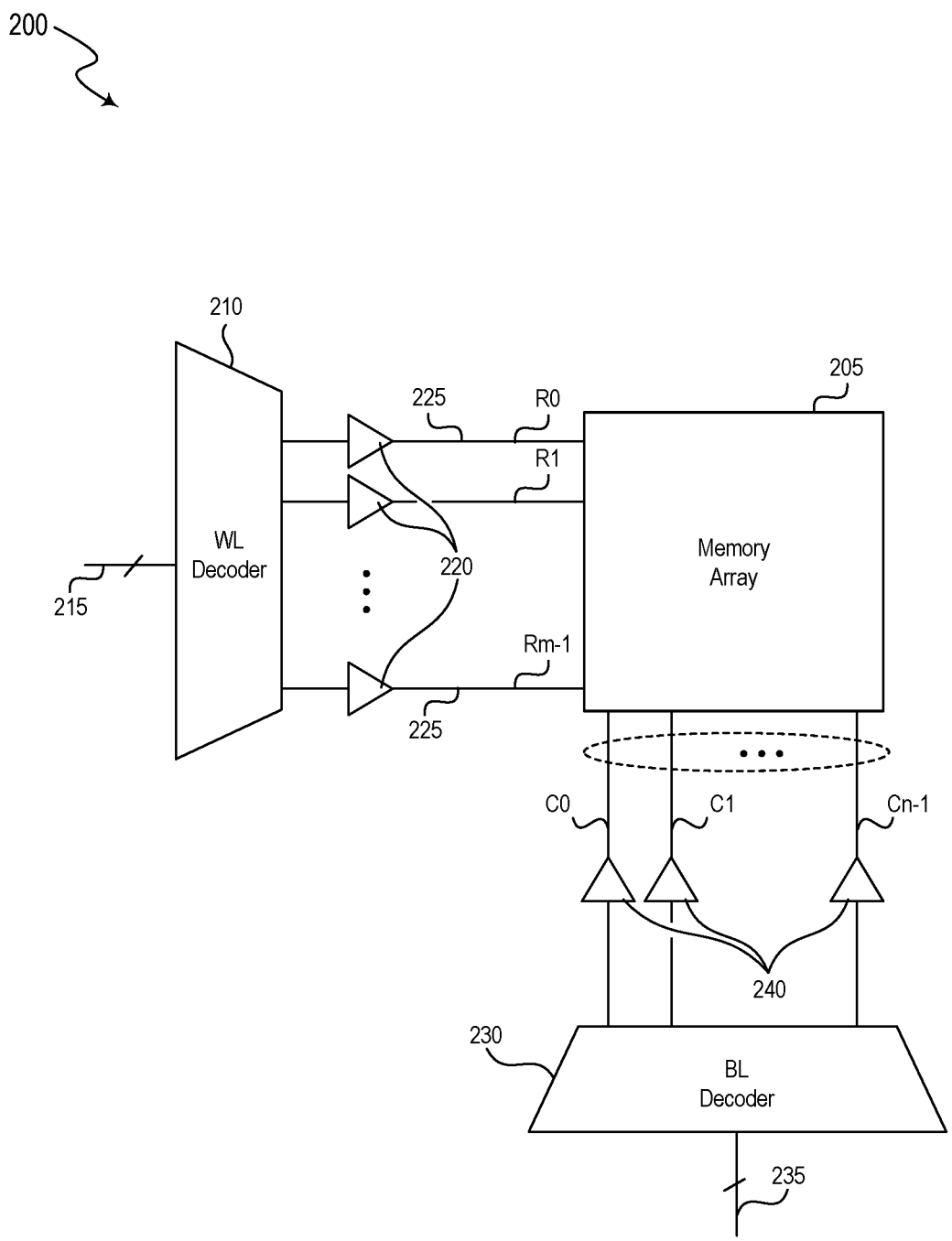
FIG. 2 is a block diagram schematically illustrating a memory array of a memory device in accordance with embodiments of the present technology.

FIG. 2 is a block diagram 200 schematically illustrating a memory array of a memory device (e.g., the memory device 100 described with reference to FIG. 1) in accordance with embodiments of the present technology. The diagram 200 includes a memory array 205 with m word lines 225 (also identified individually as R0 through Rm−1) and n bit lines (also identified individually as C0 through Cn−1), which may be an example of or includes aspects of the memory array 150 described with reference to FIG. 1. For example, each one of the m word lines is associated with the n bit lines. Further, the diagram 200 includes a word line decoder 210 (which may be an example of or include aspects of the row decoder 140) and a bit line decoder 230 (which may be an example of or include aspects of the column decoder 145).

The word line decoder 210 may receive a row address signal 215 (e.g., XADD described with reference to FIG. 1) and select one of the m word lines. Further, the word line decoder 210 may drive a word line driver 220 (which may be regarded as a part of the word line decoder 210 in some embodiments) coupled to the selected word line to control a voltage of the selected word line during memory operations. For example, the memory device may activate the selected word line (e.g., via an activate command) to "open" the row such that memory cells coupled with the row may be accessed (e.g., read, altered) through the columns associated with the row. Similarly, the memory device may deactivate the selected word line (e.g., via a precharge command) to "close" the row such that the memory cells coupled with the row may no longer be accessed.

Similarly, the bit line decoder 230 may receive a column address signal 235 (e.g., YADD described with reference to FIG. 1) and select one of the n bit lines depicted in the diagram 200. Further, the bit line decoder 230 may drive a column driver 240 (which may be regarded as a part of the bit line decoder 230 in some embodiments) coupled to the selected bit line to access (e.g., read, write) the memory cells of the open row. As such, the column address signal 235 may include a column select signal that identifies a particular column of the n bit lines to access memory cells of the selected column—e.g., each one of the columns C0 through Cn−1 corresponding to a column address. Moreover, each column (e.g., C0, C1, etc.) depicted in the diagram 200 may include multiple columns (e.g., sub-columns; not shown) that each are coupled with a group of memory cells.

By way of example, each one of the rows R0 through Rm−1 may be coupled with a total of 1,024 bytes of memory cells, respectively. Further, each one of the rows R0 through Rm−1 may be associated with sixty-four (64) columns (or column addresses). Accordingly, each one of the columns C0 through Cn−1 includes 16 bytes (i.e., 128 bits) of memory cells, which may be organized utilizing a tiered bit line architecture including local and main (or global) bit lines in some embodiments—e.g., the bit line architecture including the local I/O lines (LIOT), the main I/O lines (MIOT), and the transfer gates (TG) coupling the local and main I/O lines, as described with reference to FIG. 1. In some cases, the memory cells coupled with all the columns (or column addresses) associated with a single row (e.g., 64 column addresses) may be referred to as a page of the memory array 205.

Aspects of the present technology facilitates clearing of a row (e.g., clearing all the memory cells coupled with a row with multiple columns associated with the row, or a subset thereof) with a single command (e.g., a row clear command, a command with an indication to clear two or more columns (column addresses) of a row). Such a command may provide row clear features in a power efficient manner when compared to executing externally issued, multiple write commands to achieve the same results. Further, the command may clear the row in an expedited manner as described in more details herein. In some embodiments, the command includes aspects of an activate (ACT) command—e.g., a modified ACT command. For example, the ACT command can be changed and/or appended to include one or more bits indicating to clear two or more columns.

For example, after a row to be cleared (e.g., a target row) is activated in response to receiving a row clear command, the memory device may identify a first column (a first column address) to write a set of predetermined data that is internally available to the memory device. Once the first column (e.g., C1) is written with the predetermined data set (e.g., all memory cells associated with the first column address are over-written with the predetermined data set), the memory device may move to the next column (e.g., C2) to write the predetermined data set by updating the column select signal to identify the next column.

If the row clear command indicates to clear all the columns associated with the target row, the memory device may iterate through all the columns (i.e., all the column addresses) of the target row (e.g., C0 through Cn−1) by updating the column select signal to identify one column (a column address) at a time for the entire columns. If the row clear command indicates to clear a subset of the columns associated with the target row (e.g., by identifying an initial column Ci and a final column Cf that define a range of columns to clear), the memory device may clear the subset of columns by iterating through the columns (e.g., column addresses) of the range with the column select signal identifying the columns of the range (e.g., Ci through Cf). In some embodiments, the memory device may utilize a counter configured to identify a column address out of the column addresses associated with the target row, and to keep track of the columns written with the predetermined data set (and which columns to be written with the predetermined data set). Such a counter (or a logic circuit performing the same) may be used for an error checking and scrubbing (ECS) operation that the memory device may perform, during which the memory device may read data from the columns of a target row and perform error checking and correcting (ECC) operations to detect and/or correct errors in the data.

In some embodiments, such indications (or flags) regarding the extent of the row clear command may be included in one or more bits of the row clear command, in a register (e.g., the register 118, a multi-purpose register), or both. In some embodiments, the memory device may be preconfigured to clear certain portions of a target row based on a flag (or an indication) associated with the row clear command. For example, the memory device may include a command status table for the row clear command to designate such preconfigured portions—e.g., clearing one-half of the page, one-quarter of the page, clearing columns Ci through Cf, etc.

The set of predetermined data (which may be referred to as a data pattern or a pattern of bits, in view of a particular sequence of 1's and 0's in the predetermined data set) may be devised by a host device (e.g., a memory controller) and stored in a register (e.g., the register 118) of the memory device such that the data pattern may be internally available to the memory device when executing the row clear command. For example, the set of predetermined data may include all 1's, all 0's, or any combination of 1's and 0's. In some embodiments, the host device may determine (e.g., devise) the set of predetermined data in view of primary applications and/or operating environments, in which the memory device may be deployed—e.g., graphics applications tending to exhibit certain patterns among a group of memory cells, mobile applications sensitive to power consumption, autonomous driving applications with aggravated operating temperature range, data center applications for highly reliable data integrity, or the like. In some embodiments, the memory device may utilize the logic circuit that writes data stored in a register of the memory device to the memory array in response to an external command designating a single column (column address) to write the data from the register to the column.

Figure 3:
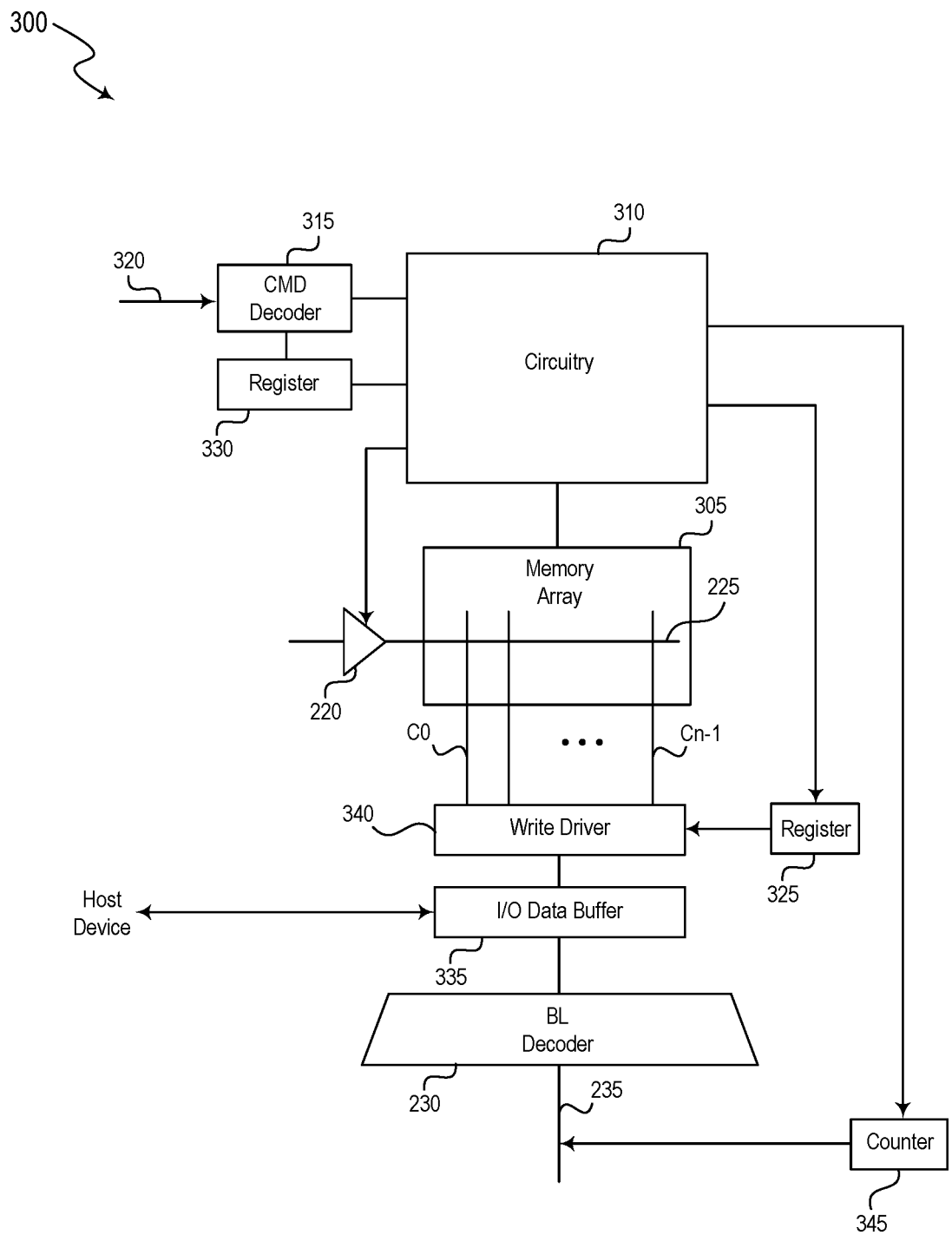
FIG. 3 is a block diagram schematically illustrating a memory device in accordance with embodiments of the present technology.

FIG. 3 is a block diagram 300 schematically illustrating a memory device (e.g., the memory devices described with reference to FIGS. 1 and 2) in accordance with embodiments of the present technology. The diagram 300 includes a memory array 305 (which may be an example of or include aspects of the memory array 150 and/or the memory array 205). The memory array 305 may include a plurality of word lines (e.g., R0 through Rm−1 described with reference to FIG. 2) and a plurality of word line drivers 220, and the diagram 300 illustrates one of each as depicted as a word line 225 and a word line driver 220 coupled thereto. Further, the memory array 305 includes a plurality of bit lines (also identified individually as C0 through Cn−1) coupled with the word lines (e.g., the word line 225). The memory device also includes peripheral circuitry 310 coupled with the memory array 305. The diagram 300 depicts that the peripheral circuitry 310 may also be coupled with a command decoder 315 (which may be an example of or include aspects of the command decoder 115), first and second registers 325 and 330 (which may be an example of or include aspects of the register 118, respectively), and a counter 345. Moreover, the memory device may include an I/O data buffer 335, a write driver 340, and the bit line decoder 230.

The peripheral circuitry 310 may be configured to receive commands from a host device (e.g., a memory controller) coupled with the memory device through a command/address bus 320. For example, the peripheral circuitry 310 may receive a command from the host device, where the command is directed to one of the rows of the memory array 305 (e.g., the row 225). The peripheral circuitry 310 may activate, in conjunction with the word line driver 220, the row 225 in response to receiving the command. Further, the command may indicate the memory device to write data to two or more columns associated with the row 225 of the memory array 305—e.g., writing the data to memory cells coupled to the columns (the column addresses) of the memory array 305 for at least two columns (two column addresses). In this regard, the host device may have written (stored) the data in a register (e.g., the register 325) of the memory device to have the data internally available when performing the command.

In some cases, the command may indicate the memory device to write the data from the register 325 to all columns associated with the row 225 of the memory array 305. In other words, the command may clear (over-write) all the memory cells coupled with each individual columns C0 through Cn−1—e.g., a page clear mode (or feature). As a result of performing the command in the page clear mode, all columns (e.g., columns C0 through Cn−1) associated with the row 225 may include an identical data pattern—e.g., writing the repeating pattern of bits for all the columns C0 through Cn−1. In other cases, the command may indicate the memory device to write the data to a subset of the columns associated with the row 225—e.g., a sub-page clear mode (or feature). In such cases, the memory device may write the data to two or more columns associated with the row 225, which may be indicated with a range of column addresses to clear—e.g., by identifying an initial column Ci and a final column Cf defining the range of columns to clear.

In this regard, the host device may be configured to program a register (e.g., the register 330) of the memory device to indicate that the command is directed to all the columns associated with the row 225 (e.g., the page clear mode) or to a subset of the columns associated with the row 225 (e.g., the sub-page clear mode). Additionally, or alternatively, the host device may be configured to program one or more bits of the command to indicate the same—e.g., whether the command is to be carried out in the page clear mode or in the sub-page clear mode. Although the diagram 300 depicts the registers 325 and 330 as two separate components, in some embodiments, a single register (e.g., the register 118) may be configured to perform functions of the register 325 (e.g., storing the data from the host device) and of the register 330 (e.g., storing indications of the modes of the command). As such, the command decoder 315 may be configured to determine that the command is directed to all the columns associated with the row 225 (e.g., the page clear mode) or to a subset of the columns associated with the row 225 (e.g., the sub-page clear mode), based on an indication that may be stored in one or more bits of the command, a register of the memory device, or both.

As the data, with which individual columns associated with the row 225 are written, are internally available from the register 325, the memory device may not need to access the I/O data buffer 335 when performing the command to store the data to the individual columns. In this regard, the memory device may load the data pattern to the write driver 340 from the register 325 without receiving the data from the host device through the I/O data buffer 335. The write driver 340 may be configured to provide a data pattern for each individual columns, the data pattern corresponding to the data in the register 325. Further, as the data pattern is maintained the same while different columns are written with the data, once the memory device loads (e.g., activate) the write driver 340 with the data pattern to write a first column of the memory array 305, the memory device does not need to alter the data pattern of the write driver 340 when writing subsequent columns. In this manner, the memory device may save power and time to perform the row clear command when compared to performing multiple external write commands—e.g., saving a time for stabilizing external data in the I/O data buffer 335, saving a time and power consumption to toggle the write driver 340 for different columns, among others.

The counter 345 may be configured to identify a column address to write the data—e.g., one column address at a time. In some embodiments, the counter 345 may provide the column address to the bit line decoder 230 via the column address signal 235 such that the memory device can identify the column to write the data based on the counter. In such embodiments, the bit line decoder 230 may identify which column to select based on the column address provided from the counter 345 to the bit line decoder 230, in lieu of decoding a column address signal (e.g., the column address signal 235). Further, the counter 345 may be configured to generate (iterate through) all column addresses corresponding to all the columns associated with the row 225. In this manner, the memory device may write the data to all the columns (all the column addresses) associated with the row 225 by writing the data to individual columns identified by the counter 345 as the counter 345 iterates through all the columns (column addresses)—e.g., performing the full row clear operation (i.e., the page clear mode).

Similarly, the memory device may carry out the command in the sub-page clear mode, in conjunction with the counter 345—e.g., the command identifying an initial column Ci and a final column Cf defining a range of columns to clear. For example, the memory device may write the data to a first column (e.g., Ci) associated with the row 225, where the counter 345 identifies a first address of the first column. Subsequently, the memory device may update the counter 345 to identify a second address of a second column to write the data. After writing the data to the second column, the memory device may determine that the second address corresponds to an address of a last column of the range (e.g., Cf), and may stop updating the counter 345. If the second address does not correspond to the address of the last column of the range (or otherwise determining that there are more columns to write in the range), the memory device may update the counter 345 to continue to write the data to the next columns until all the columns within the range are written with the data.

The memory device may complete writing a single column with the internally available data within a duration, tCCDclear, which may be less than another duration tCCD_L corresponding to a duration for the memory device to complete an external write command writing a single column with an externally provided data from a host device. The tCCDclear may be less than the tCCD_L because the memory device may omit accessing the I/O data buffer 335, altering the data pattern loaded in the write driver 340, performing an error checking and correcting (ECC) operation for the external data, among others. Further, the memory device "knows" which column to write the data next—e.g., by utilizing the counter that iterates (cycles) through each individual columns associated with the row, such that the memory device may reduce a time between writing one column to the next.

When the memory device completes writing the data to the columns associated with the row 225, either all the columns C0 through Cn−1 (e.g., a full row clear operation, a page clear mode) or a subset of the columns designated by the command (e.g., a partial row clear operation, a sub-page clear mode), the memory device may wait for a predetermined duration, prior to deactivating the row 225 (e.g., by executing a precharge command to the row 225). For example, the predetermined duration may correspond to tWR, a time required to elapse from the last write command executed to the last column, prior to deactivating the row 225. In some embodiments, tWR may ensure fidelity of the data written to the memory cells coupled with the last column. After waiting for the predetermined duration (e.g., tWR), the memory device may perform the precharge operation to deactivate (e.g., close) the row 225.

In some embodiments, the memory device may receive the precharge command from the host device to deactivate the row. In some embodiments, the memory device may deactivate the row without receiving the precharge command from the host device, which may be referred to as an auto-precharge mode. In this regard, the memory device operating in the auto-precharge mode may be configured to deactivate the row in response to receiving the command that has activated row—e.g., deactivating the row without receiving one or more additional commands from the host device.

In some embodiments, the full row clear command (e.g., the command in the page clear mode) can be associated with a timing parameter, tRowClear, which may be expressed as:

$$tRowClear = tCCDclear \times N + tWR$$

The parameter N corresponds to a quantity of columns (column addresses) associated with a row to clear. In such embodiments, the host device may transmit the precharge command to the memory device to deactivate the row after the time tRowClear has elapsed since transmitting the full row clear command.

Figure 4:
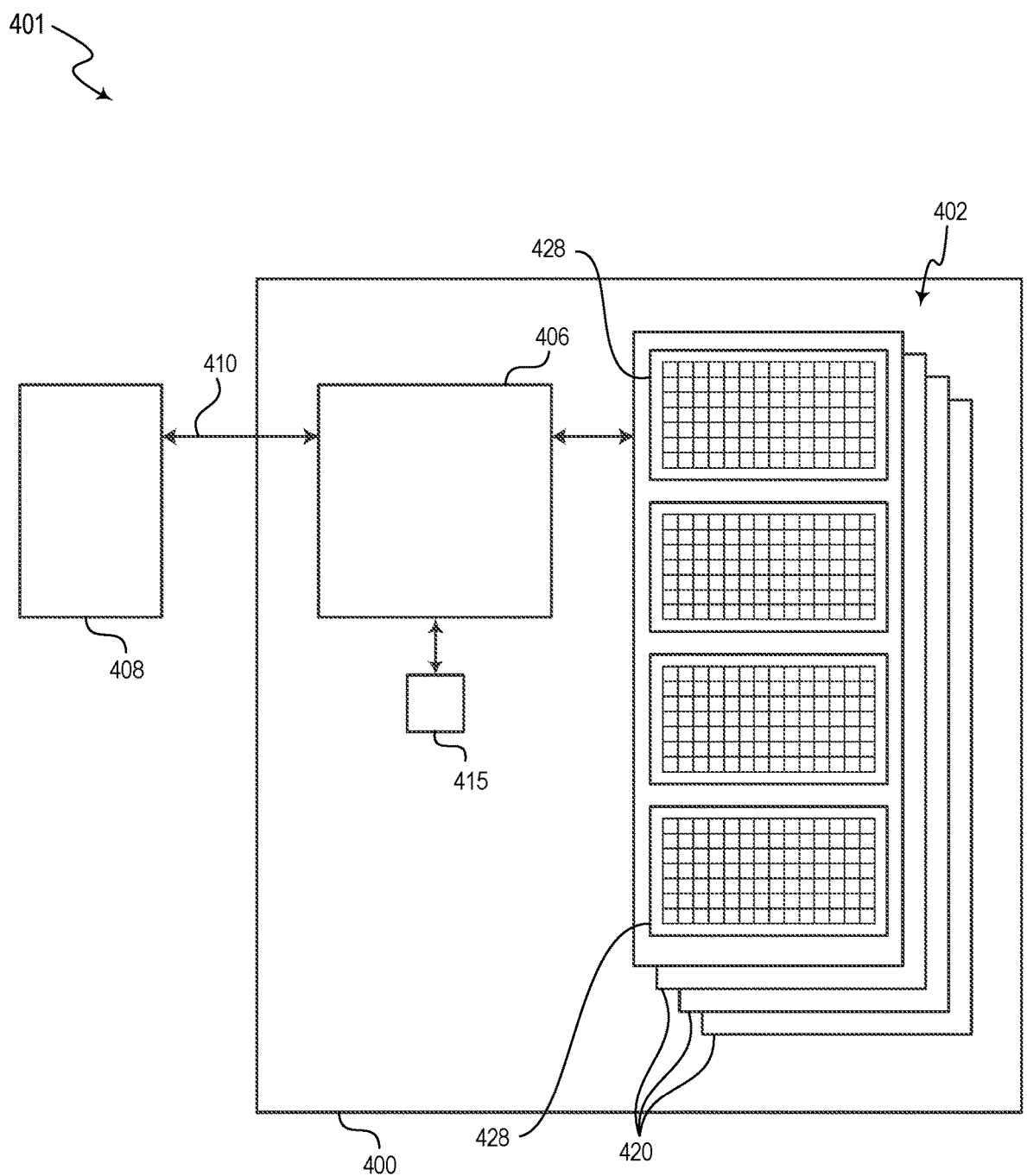
FIG. 4 is a block diagram of a system having a memory device configured in accordance with embodiments of the present technology.

FIG. 4 is a block diagram of a system 401 having a memory device 400 configured in accordance with embodiments of the present technology. The memory device 400 may be an example of or include aspects of the memory device described with reference to FIGS. 1 through 3. As shown, the memory device 400 includes a main memory 402 (e.g., DRAM, NAND flash, NOR flash, FeRAM, PCM, etc.) and control circuitry 406 operably coupled to a host device 408 (e.g., an upstream central processor (CPU), a memory controller). The control circuitry 406 may include aspects of various components described with reference to FIGS. 1 through 3. For example, the control circuitry 406 may include aspects of the command/address input circuit 105, the address decoder 110, the command decoder 115 and/or 315, the word line decoder 210, the peripheral circuitry 310, among others.

The main memory 402 includes a plurality of memory units 420, which each include a plurality of memory cells. The memory units 420 can be individual memory dies, memory planes in a single memory die, a stack of memory dies vertically connected with through-silicon vias (TSVs), or the like. For example, in one embodiment, each of the memory units 420 can be formed from a semiconductor die and arranged with other memory unit dies in a single device package. In other embodiments, multiple memory units 420 can be co-located on a single die and/or distributed across multiple device packages. The memory units 420 may, in some embodiments, also be sub-divided into memory regions 428 (e.g., banks, ranks, channels, blocks, pages, etc.).

The memory cells can include, for example, floating gate, charge trap, phase change, capacitive, ferroelectric, magnetoresistive, and/or other suitable storage elements configured to store data persistently or semi-persistently. The main memory 402 and/or the individual memory units 420 can also include other circuit components, such as multiplexers, decoders, buffers, read/write drivers, address registers, data out/data in registers, etc., for accessing and/or programming (e.g., writing) the memory cells and other function, such as for processing information and/or communicating with the control circuitry 406 or the host device 408. Although shown in the illustrated embodiments with a certain number of memory cells, rows, columns, regions, and memory units for purposes of illustration, the number of memory cells, rows, columns, regions, and memory units can vary, and can, in other embodiments, be larger or smaller in scale than shown in the illustrated examples. For example, in some embodiments, the memory device 400 can include only one memory unit 420. Alternatively, the memory device 400 can include two, three, four, eight, ten, or more (e.g., 16, 32, 64, or more) memory units 420. Although the memory units 420 are shown in FIG. 4 as including four memory regions 428 each, in other embodiments, each memory unit 420 can include one, two, three, eight, or more (e.g., 16, 32, 64, 100, 128, 256, or more) memory regions.

In one embodiment, the control circuitry 406 can be provided on the same die as the main memory 402 (e.g., including command/address/clock input circuitry, decoders, voltage and timing generators, input/output circuitry, etc.). In another embodiment, the control circuitry 406 can be a microcontroller, special purpose logic circuitry (e.g., a field programmable gate array (FPGA), an application specific integrated circuit (ASIC), control circuitry on a memory die, etc.), or other suitable processor. In one embodiment, the control circuitry 406 can include a processor configured to execute instructions stored in memory to perform various processes, logic flows, and routines for controlling operation of the memory device 400, including managing the main memory 402 and handling communications between the memory device 400 and the host device 408. In some embodiments, the control circuitry 406 can include embedded memory with memory registers for storing, e.g., memory addresses, row counters, bank counters, memory pointers, fetched data, etc. In another embodiment of the present technology, a memory device 400 may not include control circuitry, and may instead rely upon external control (e.g., provided by the host device 408, or by a processor or controller separate from the memory device 400).

The host device 408 can be any one of a number of electronic devices capable of utilizing memory for the temporary or persistent storage of information, or a component thereof. For example, the host device 408 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device 408 may be a networking device (e.g., a switch, a router, etc.) or a recorder of digital images, audio and/or video, a vehicle, an appliance, a toy, or any one of a number of other products. In one embodiment, the host device 408 may be connected directly to memory device 400, although in other embodiments, the host device 408 may be indirectly connected to memory device (e.g., over a networked connection or through intermediary devices).

In operation, the control circuitry 406 can directly write or otherwise program (e.g., erase) the various memory regions of the main memory 402. The control circuitry 406 communicates with the host device 408 over a host-device bus or interface 410. In some embodiments, the host device 408 and the control circuitry 406 can communicate over a dedicated memory bus (e.g., a DRAM bus). In other embodiments, the host device 408 and the control circuitry 406 can communicate over a serial interface, such as a serial attached SCSI (SAS), a serial AT attachment (SATA) interface, a peripheral component interconnect express (PCIe), or other suitable interface (e.g., a parallel interface). The host device 408 can send various requests (in the form of, e.g., a packet or stream of packets) to the control circuitry 406. A request can include a command to read, write, erase, return information, and/or to perform a particular operation (e.g., a refresh operation, a TRIM operation, a precharge operation, an activate operation, a wear-leveling operation, a garbage collection operation, etc.).

In some embodiments, the memory device 400 may receive a command from the host device 408 over the interface 410. The command may be directed to a row of a memory array (e.g., the main memory 402), where the row is associated with a set of columns. The memory device 400 may activate the row in response to receiving the command and write data from a register (e.g., the register 415) to two or more columns of the set. In some embodiments, the host device 408 may have predetermined the data and stored in the register of the memory device 400. Subsequently, the memory device 400 may deactivate the row based, at least in part, on writing the data to the two or more columns of the set.

In some embodiments, the host device 408 may store the data in the register 415 of the memory device to have the data internally available to the memory device 400, prior to transmitting the command to the memory device 400. Further, the host device 408 may be configured to program a second register (not shown) of the memory device 400 to indicate the command is directed to each individual column of the set or to a subset of the columns. Additionally, or alternatively, the host device 408 may be configured to program one or more bits of the command to indicate that the command is directed to all the columns of the set or to the subset of the columns.

Figure 5:
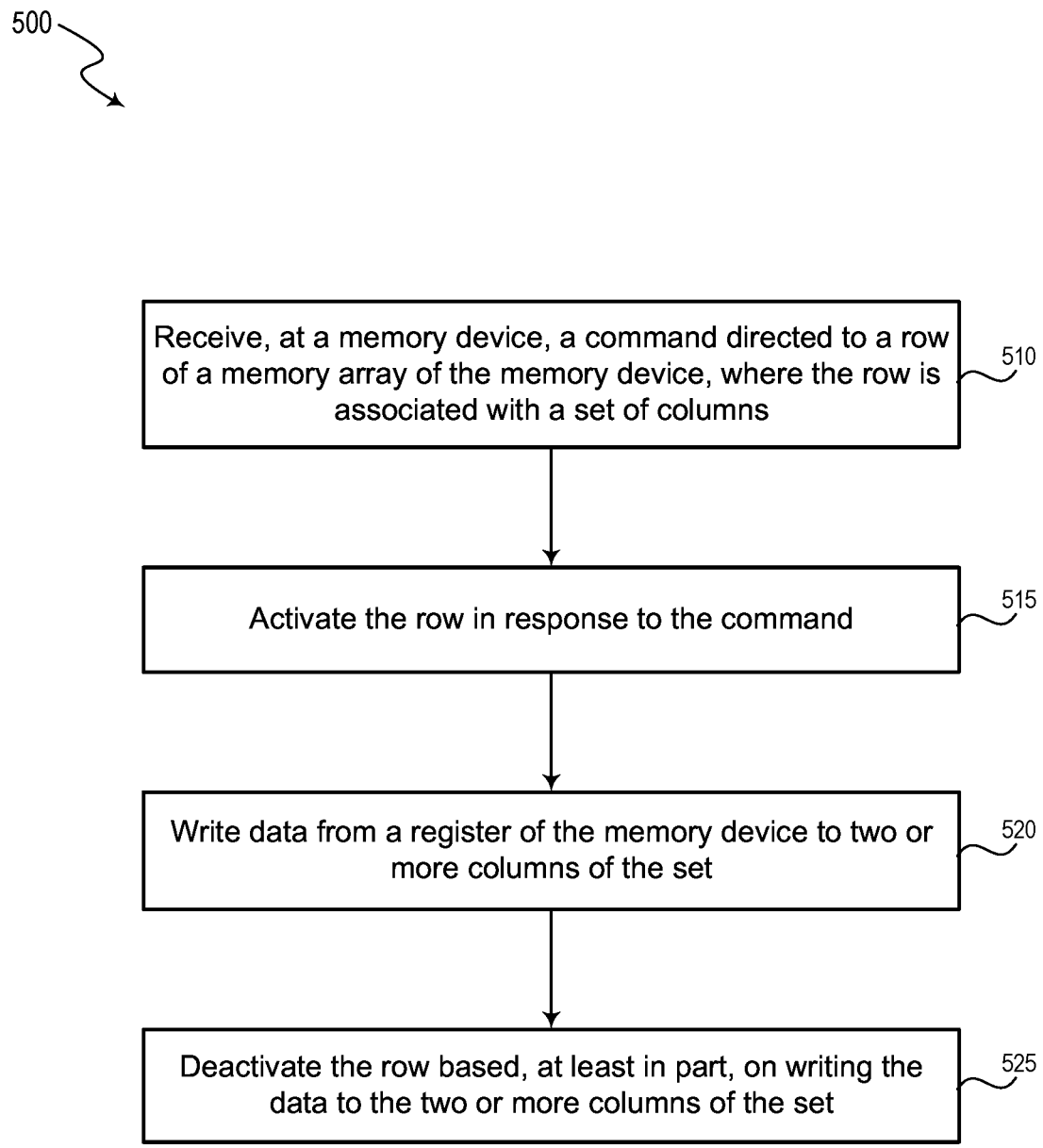
FIG. 5 is a flowchart illustrating a method of operating a memory device in accordance with embodiments of the present technology.

FIG. 5 is a flow chart 500 illustrating a method of operating a memory device in accordance with embodiments of the present technology. The flow chart 500 may be an example of or include aspects of a method that the memory device (e.g., the peripheral circuitry 310, the control circuitry 406) may perform as described with reference to FIGS. 1 through 4.

The method includes receiving, at a memory device, a command directed to a row of a memory array of the memory device, where the row is associated with a set of columns (box 510). In accordance with one aspect of the present technology, the receiving feature of box 510 can be performed by the peripheral circuitry 310 (or the control circuitry 406), as described with reference to FIGS. 1 through 5.

The method further includes activating the row in response to the command (box 515). In accordance with one aspect of the present technology, the activating feature of box 515 can be performed by the peripheral circuitry 310 (or the control circuitry 406), as described with reference to FIGS. 1 through 5.

The method further includes writing data from a register of the memory device to two or more columns of the set (box 520). In accordance with one aspect of the present technology, the writing feature of box 520 can be performed by the peripheral circuitry 310 (or the control circuitry 406), as described with reference to FIGS. 1 through 5.

The method further includes deactivating the row based, at least in part, on writing the data to the two or more columns of the set (box 525). In accordance with one aspect of the present technology, the deactivating feature of box 525 can be performed by the peripheral circuitry 310 (or the control circuitry 406), as described with reference to FIGS. 1 through 5.

In some embodiments, each column of the set is coupled with a plurality of memory cells. In some embodiments, the command is an activate (ACT) command. In some embodiments, writing the data from the register of the memory device to the two or more columns of the set comprises writing a repeating pattern of bits based on the data from the register. In some embodiments, the method can further include activating, prior to writing the data, a write driver of the memory device in accordance with a data pattern of the data stored in the register, the write driver configured to couple with a column of the set, and maintaining the write driver activated with the data pattern while writing the data to the two or more columns of the set.

In some embodiments, writing the data to the two or more columns of the set is performed without accessing a data input buffer of the memory device. In some embodiments, deactivating the row is performed in response to the command that has activated the row. In some embodiments, the method can further include determining that the command is directed to each individual column of the set, based on an indication stored in one or more bits of the command, a second register of the memory device, or both. In some embodiments, the method can further include writing the data to individual columns of the set based on a counter of the memory device configured to identify a column address, wherein the counter is further configured to iterate through all column addresses corresponding to the individual columns of the set.

In some embodiments, the method can further include waiting, prior to deactivating the row, for a predetermined duration after writing the data to the individual columns of the set. In some embodiments, the method can further include receiving an additional command directed to the row of the memory array, the additional command received after a predetermined duration since receiving the command, where deactivating the row is performed in response to receiving the additional command. In some embodiments, the method can further include determining that the command is directed to a subset of the columns including the two or more columns, where the determination is based on an indication stored in one or more bits of the command, a second register of the memory device, or both, writing the data to a first column of the subset, where a counter of the memory device identifies a first address of the first column of the subset, updating the counter to identify a second address of a second column of the subset to write the data, and writing the data to the second column of the subset based on the counter identifying the second address. In some embodiments, the method can further include determining that the second address corresponds to an address of a last column of the subset, and waiting for a predetermined duration, prior to deactivating the row.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A method, comprising:
   receiving, at a memory device, a command directed to a row of a memory array of the memory device, wherein the row is associated with a set of columns;
   activating the row in response to the command;
   writing data from a single register of the memory device to two or more columns of the set; and
   deactivating the row based, at least in part, on writing the data to the two or more columns of the set,
   wherein writing the data from the single register of the memory device to the two or more columns of the set comprises writing a repeating pattern of bits based on the data from the single register.

2. The method of claim 1, wherein the command is an activate (ACT) command.

3. The method of claim 1, further comprising:
activating, prior to writing the data, a write driver of the memory device in accordance with a data pattern of the data stored in the single register, the write driver configured to couple with a column of the set; and
maintaining the write driver activated with the data pattern while writing the data to the two or more columns of the set.

4. The method of claim 1, wherein writing the data to the two or more columns of the set is performed without accessing a data input buffer of the memory device.

5. The method of claim 1, wherein deactivating the row is performed in response to the command that has activated the row.

6. The method of claim 1, further comprising:
determining that the command is directed to each individual column of the set, based on an indication stored in one or more bits of the command, a second register of the memory device, or both.

7. The method of claim 6, further comprising:
writing the data to individual columns of the set based on a counter of the memory device configured to identify a column address, wherein the counter is further configured to iterate through all column addresses corresponding to the individual columns of the set.

8. The method of claim 7, further comprising:
waiting, prior to deactivating the row, for a predetermined duration after writing the data to the individual columns of the set.

9. The method of claim 6, further comprising:
receiving an additional command directed to the row of the memory array, the additional command received after a predetermined duration since receiving the command, wherein deactivating the row is performed in response to receiving the additional command.

10. The method of claim 1, further comprising:
determining that the command is directed to a subset of the columns including the two or more columns, wherein the determination is based on an indication stored in one or more bits of the command, a second register of the memory device, or both;
writing the data to a first column of the subset, wherein a counter of the memory device identifies a first address of the first column of the subset;
updating the counter to identify a second address of a second column of the subset to write the data; and
writing the data to the second column of the subset based on the counter identifying the second address.

11. The method of claim 10, further comprising:
determining that the second address corresponds to an address of a last column of the subset; and
waiting for a predetermined duration, prior to deactivating the row.

12. An apparatus, comprising:
a memory array including a row and a set of columns associated with the row; and
peripheral circuitry coupled with the memory array, the peripheral circuitry configured to:
receive a command directed to the row;
activate the row in response to receiving the command;
write data from a single register of the apparatus to two or more columns of the set; and
deactivate the row based, at least in part, on writing the data to the two or more columns of the set,
wherein the peripheral circuitry configured to write the data from the single register of the memory device to the two or more columns of the set by writing a repeating pattern of bits based on the data from the single register.

13. The apparatus of claim 12, further comprising:
a write driver coupled with the single register, and configured to provide a data pattern for a column of the set, the data pattern corresponding to the data stored in the single register.

14. The apparatus of claim 12, further comprising:
a second register configured to store an indication that the command is directed to each individual column of the set or to a subset of the columns.

15. The apparatus of claim 12, further comprising:
a command decoder configured to determine that the command is directed to each individual column of the set or to a subset of the columns, based on an indication stored in one or more bits of the command.

16. The apparatus of claim 12, further comprising:
a counter configured to identify a column address, wherein the counter is further configured to iterate through all column addresses corresponding to individual columns of the set.

17. A system, comprising:
a host device, and
a memory device coupled with the host device, the memory device including:
a memory array having a row and a set of columns associated with the row; and
peripheral circuitry coupled with the memory array, the peripheral circuitry configured to:
receive, from the host device, a command directed to the row;
activate the row in response to receiving the command;
write data from a single register of the memory device to two or more columns of the set; and
deactivate the row based, at least in part, on writing the data to the two or more columns of the set,
wherein the peripheral circuitry configured to write the data from the single register of the memory device to the two or more columns of the set by writing a repeating pattern of bits based on the data from the single register.

18. The system of claim 17, wherein the host device is configured to store the data in the single register of the memory device such that the memory device writes the data to the two or more columns of the set.

19. The system of claim 17, wherein the host device is configured to perform at least one of:
programming a second register of the memory device to indicate the command is directed to each individual column of the set or to a subset of the columns; or
programming one or more bits of the command to indicate the command is directed to each individual column of the set or to the subset of the columns.

* * * * *